United States Patent
Lau (10) Patent No.: US 9,391,600 B2
(45) Date of Patent: Jul. 12, 2016

(54) VOLTAGE LEVEL SHIFT WITH CHARGE PUMP ASSIST

(75) Inventor: Ker Yon Lau, Bayan Lepas (MY)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/997,594

(22) PCT Filed: Apr. 16, 2012

(86) PCT No.: PCT/MY2012/000084
§ 371 (c)(1),
(2), (4) Date: Sep. 26, 2014

(87) PCT Pub. No.: WO2013/157915
PCT Pub. Date: Oct. 24, 2013

(65) Prior Publication Data
US 2015/0288355 A1    Oct. 8, 2015

(51) Int. Cl.
*H03L 5/00* (2006.01)
*H03K 17/10* (2006.01)
*H02M 3/07* (2006.01)
*H03K 3/356* (2006.01)
*H04B 1/40* (2015.01)

(52) U.S. Cl.
CPC .............. *H03K 17/102* (2013.01); *H02M 3/07* (2013.01); *H03K 3/356113* (2013.01); *H04B 1/40* (2013.01)

(58) Field of Classification Search
None
See application file for complete search history.

(56) References Cited

U.S. PATENT DOCUMENTS

| 7,218,165 | B1 | 5/2007 | Tsai |
| 7,804,326 | B1* | 9/2010 | Chen ................ H03K 3/356104 326/68 |
| 2004/0036363 | A1 | 2/2004 | Sarig et al. |
| 2006/0208775 | A1 | 9/2006 | Tobita et al. |
| 2007/0013415 | A1* | 1/2007 | Owen .................... G11C 7/062 327/77 |

(Continued)

FOREIGN PATENT DOCUMENTS

WO    2013157915 A1    10/2013

OTHER PUBLICATIONS

International Search report and Written Opinion Received for PCT Patent Application No. PCT/MY2013/000084, mailed on Jan. 2, 2013, 8 pages.

(Continued)

*Primary Examiner* — Lincoln Donovan
*Assistant Examiner* — Khareem E Almo
(74) *Attorney, Agent, or Firm* — Garrett IP, LLC (57) ABSTRACT

A charge pump assist circuit to assist a voltage level shifter to toggle an output based on an input. The charge pump assist circuit may be implemented to toggle the output at a higher rate than the voltage level shifter. The voltage level shifter may be biased with an undivided voltage rail, such as an operating voltage of the charge pump assist circuit, rather than a divided voltage rail, while maintaining or increasing a toggle rate. The charge pump assist circuit may include a non-overlapping control generator to generate non-overlapping differential controls, and may further include first and second charge pump multipliers to increase voltages of the differential controls by a multiple of the operating voltage.

19 Claims, 8 Drawing Sheets

(56) References Cited

U.S. PATENT DOCUMENTS

| | | | |
|---|---|---|---|
| 2007/0290730 A1* | 12/2007 | Dai | H03K 5/1565 327/175 |
| 2009/0096491 A1* | 4/2009 | Nishimura | G09G 3/3688 327/108 |
| 2009/0141521 A1* | 6/2009 | Yang | H02M 3/33592 363/49 |
| 2009/0261873 A1 | 10/2009 | Lin et al. | |
| 2009/0322379 A1* | 12/2009 | Tomita | H03K 5/1532 327/58 |
| 2010/0127744 A1* | 5/2010 | Matsubara | H03K 5/1565 327/175 |
| 2010/0214032 A1* | 8/2010 | Hinrichs | H03F 3/45659 331/57 |
| 2012/0176177 A1* | 7/2012 | Phillips | H03K 17/163 327/399 |
| 2012/0313667 A1* | 12/2012 | Thomas | G11C 27/02 327/94 |
| 2012/0313670 A1* | 12/2012 | Thomas | G11C 27/024 327/109 |
| 2013/0195165 A1* | 8/2013 | Poulton | H04B 1/04 375/229 |
| 2013/0241624 A1* | 9/2013 | Olson | H03K 19/018521 327/333 |
| 2013/0293310 A1* | 11/2013 | Levesque | H03F 1/0227 330/295 |
| 2014/0197871 A1* | 7/2014 | Pelley | H03K 3/021 327/166 |
| 2014/0307499 A1* | 10/2014 | Hamamoto | H02M 3/073 365/148 |

OTHER PUBLICATIONS

Notice of Allowance received for Taiwanese Patent Application No. 102206820, mailed on Feb. 24, 2014, 3 pages and one page of English translation.

Office Action Received for Taiwan Patent Application No. 102206820, mailed on Oct. 31, 2013, 7 pages and 3 pages of English translation.

Reply to Taiwanese Office Action dated Oct. 31, 2013 for Taiwan Patent Application No. 102206820 mailed on Dec. 17, 2013, 36 pages and 21 pages of English translation.

Allowed Claims for Taiwan Patent Application No. 102206820, 3 pages and 2 pages of English Translation.

* cited by examiner

VOLTAGE LEVEL SHIFT WITH CHARGE PUMP ASSIST

BACKGROUND

A voltage level shifter may be implemented to level shift data from a local voltage swing to an output voltage swing defined by an output voltage, where the voltage swings are defined by corresponding voltage rails.

A toggle frequency of a voltage level shifter may be a function of a bias voltage applied to the voltage level shifter.

A voltage level shifter may include a stacked-transistor voltage divider to generate an optimum bias voltage from one of the voltage rails. A stacked-transistor voltage divider may, however, leak substantial power when the voltage level shifter is idle (i.e., unchanging input data).

BRIEF DESCRIPTION OF THE DRAWINGS/FIGURES

In the drawings, the leftmost digit(s) of a reference number identifies the drawing in which the reference number first appears.

DETAILED DESCRIPTION

Figure 1:
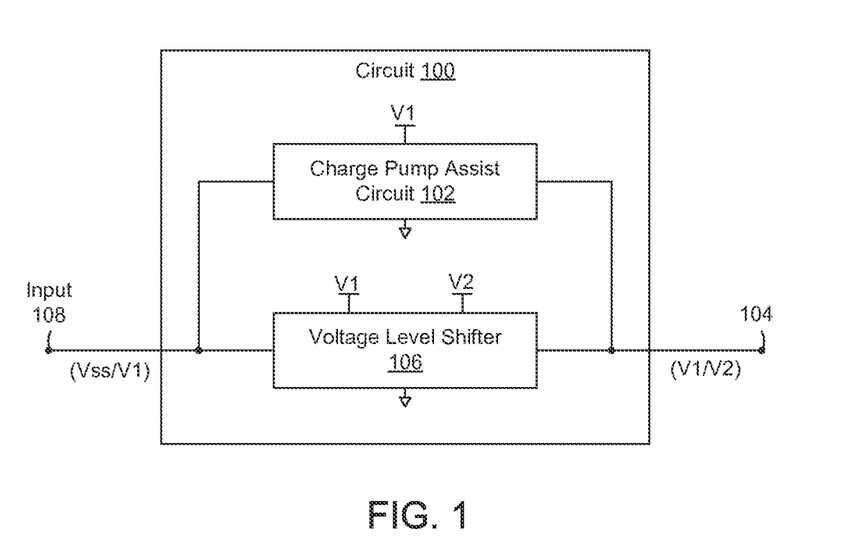
FIG. 1 is a block diagram of a circuit including a voltage level shifter and a charge pump circuit to assist the voltage level shifter to toggle an output.

FIG. 1 is a block diagram of a circuit 100 including a voltage level shifter (LS) 106, and a charge pump assist circuit 102 to assist LS 106 to toggle an output 104.

In FIG. 1, LS 106 is implemented to level shift an input 108 from a first voltage swing to a second voltage swing. For illustrative purposes, the first voltage swing is defined herein by a voltage reference Vss (lower limit), and a first voltage rail V1 (upper limit), denoted herein as Vss/V1. The second voltage swing is defined by the first voltage rail V1 (lower limit), and a second voltage rail V2 (upper limit). Magnitudes of the first and second voltage swings may be equal to one another, or may differ from one another.

When input 108 is at Vss, LS 106 outputs V1 at output 104. Conversely, when input 108 is at V1, LS 106 outputs V2 at output 104.

Charge pump assist circuit 102 is implemented to assert the same voltage at output 104 as LS 106, but with less delay. Example implementations of charge pump assist circuit 102 are provided further below.

Figure 2:
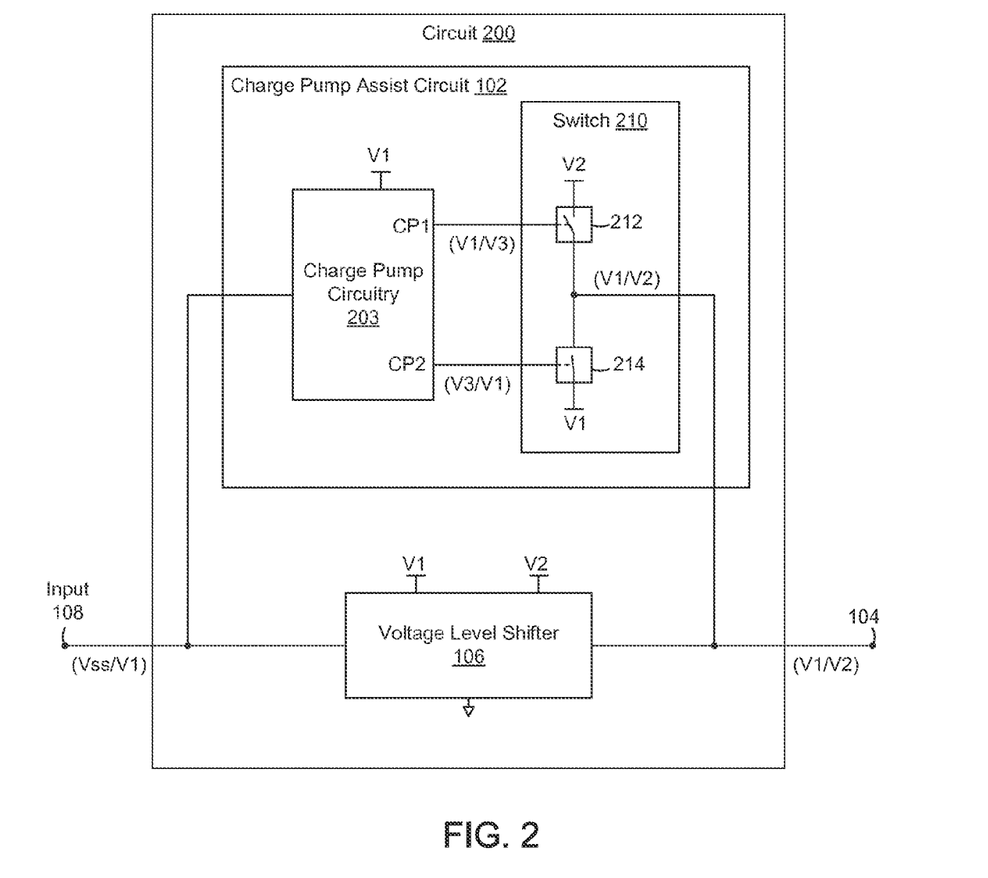
FIG. 2 is a block diagram of a circuit in which the charge pump assist circuit includes charge pump circuitry to provide differential controls CP1 and CP2, and a differentially controllable switch.

FIG. 2 is a block diagram of a circuit 200 in which charge pump assist circuit 102 includes charge pump circuitry 203 to provide differential controls CP1 and CP2, and a differentially controllable switch 210, including switches 212 and 214. When input 108 is at Vss, CP1 controls switch 212 to open and CP2 controls switch 214 to close to pull-down output 104 to V1. When input 108 is at V1, CP2 controls switch 214 to open and CP1 controls switch 212 to close to pull-up output 104 to V2.

Switches 212 and 214 may switch substantially instantaneously in response to changes in CP1 and CP2. This may permit the output 104 to toggle at a frequency determined by charge pump circuitry 203, unconstrained by delays of LS 106. Charge pump assist may be particularly useful where a difference between V2 and V1 is less than 2 times a threshold voltage (Vt) headroom, which might otherwise limit a toggle rate of output 104.

In the example of FIG. 1, CP1 and CP2 swing between V1 and V3. The following example voltages are provided for illustrative purposes:

Vss=ground or 0 volts;
V1=1.8 volts;
V2=3.6 volts; and
V3=2*V1=3.6 volts.

Methods and systems disclosed herein are not, however, limited to these examples.

In the example above, voltage swings of CP1, CP2, and input 108 have equal magnitudes (V1–Vss=1.8 volts). The voltage swing of input 108 is centered about (V1–Vss)/2=0.9 volts, whereas the voltage swings of CP1 and CP2 are centered 1.8 volts above that of input 108 (i.e., 2.7 volts). In this example, CP1 and CP2 represent voltage level shifted, differential replicas of input 108.

Charge pump circuitry 203 may include a charge pump voltage multiplier to assert V3 as a multiple of V1. In the example above, where V1=1.8 volts and V2=3.3 volts, V3=3.6 is suitable for turning-on switches 212 and 214. Charge pump circuitry 203 is not, however, limited to a voltage multiplier.

Without charge pump assist, a maximum toggle rate of a voltage level shifter may be achieved with a bias voltage that differs from available voltage rails. In such a situation, the bias voltage may be generated from an available voltage rail and a stacked transistor voltage divider (e.g., a 1.65 bias voltage from a 3.3 volt rail), such as described further above.

With charge pump assist, LS 106 may use an available voltage rail, such as V1, as a bias voltage, while maintaining or increasing the maximum toggle rate. Moreover, charge pump assist may consume less power during idle periods than a stacked transistor voltage divider.

Charge pump circuitry 203 may be implemented to generate CP1 and CP2 based on a single-ended input 108. Charge pump circuitry 203 may be further implemented to generate CP1 and CP2 with non-overlapping edges, such as to preclude switches 212 and 214 from being turned on at the same time.

Charge pump circuitry 203 may be implemented with a differential voltage level shifter, such as described below with reference to FIG. 3.

Figure 3:
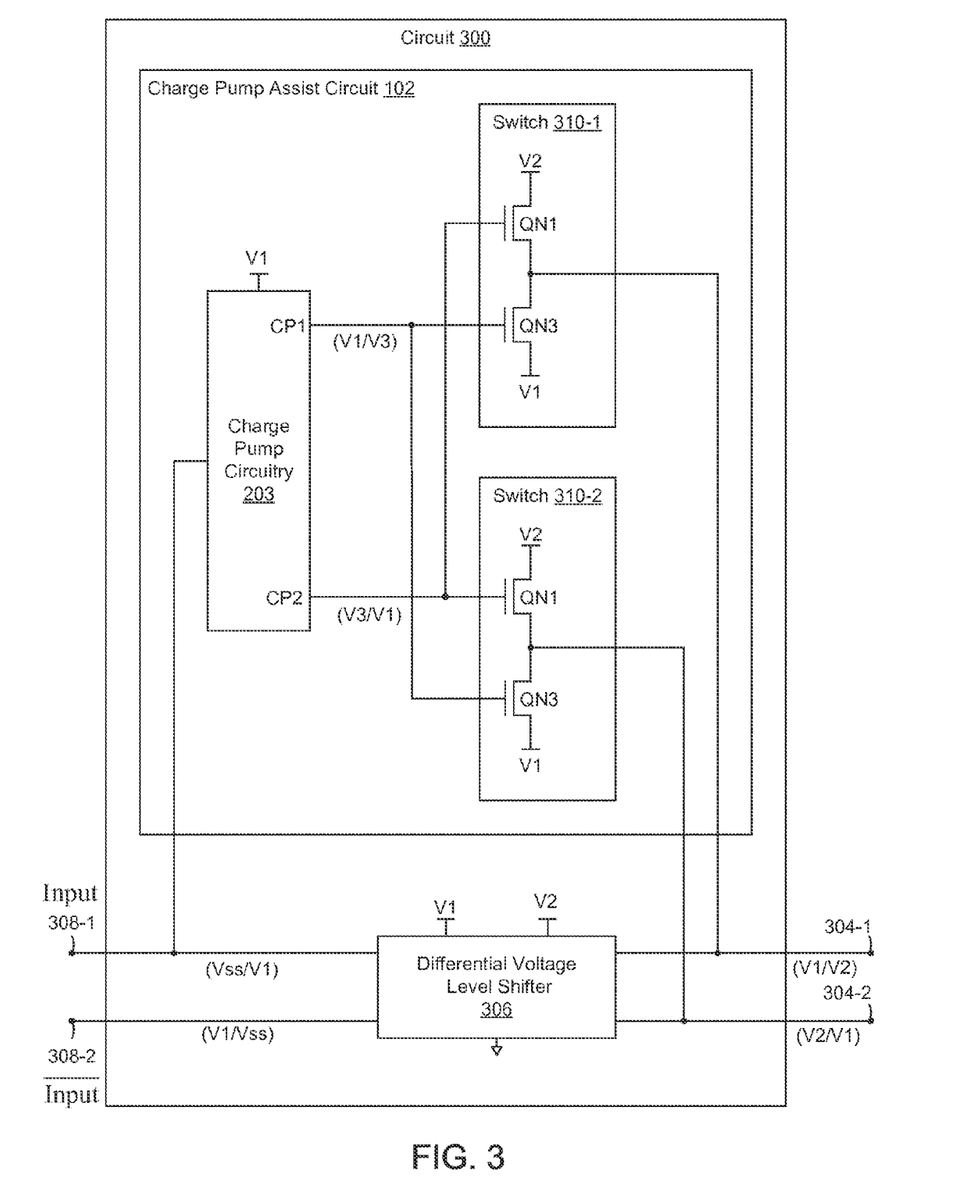
FIG. 3 is a block diagram of a circuit in which the charge pump assist circuit is implemented to assist a differential voltage level shifter.

FIG. 3 is a block diagram of a circuit 300 in which charge pump assist circuit 102 is implemented to assist a differential voltage level shifter (LS) 306.

LS 306 includes differential inputs to receive an input 308-1 and a corresponding complementary $\overline{\text{Input}}$ 308-2. LS 306 further includes differential outputs 304-1 and 304-2.

Circuit 300 includes first and second switches 310-1 and 310-2, each to couple a corresponding one of outputs 304-1 and 304-2 to one of voltage rails V1 and V2.

When input 308-1 is at Vss, charge pump circuitry 203 asserts V1 on CP1 and V2 on CP2. At switch 310-1, QN2 turns off and QN4 turns on to pull-down output 304-1 to V1. Conversely, at switch 310-2, QN3 turns off and QN1 turns on to pull-up output 304-2 to V2.

Conversely, when input 308-1 is at V1, charge pump circuitry 203 asserts V2 on CP1 and V1 on CP2. At switch 310-1, QN4 turns off and QN2 turns on to pull-up output 304-1 to V2. Conversely, at switch 310-2, QN1 turns off and QN3 turns on to pull-down output 304-2 to V1.

As with switches 212 and 214 in FIG. 2, QN1 through QN4 may switch substantially instantly in response to changes in CP1 and CP2. This may permit outputs 304-1 and 304-2 to toggle at a frequency determined charge pump circuitry 203, unconstrained by delays of LS 306.

LS 306 may be implemented as described below with reference to FIG. 4 and/or FIG. 5.

Figure 4:
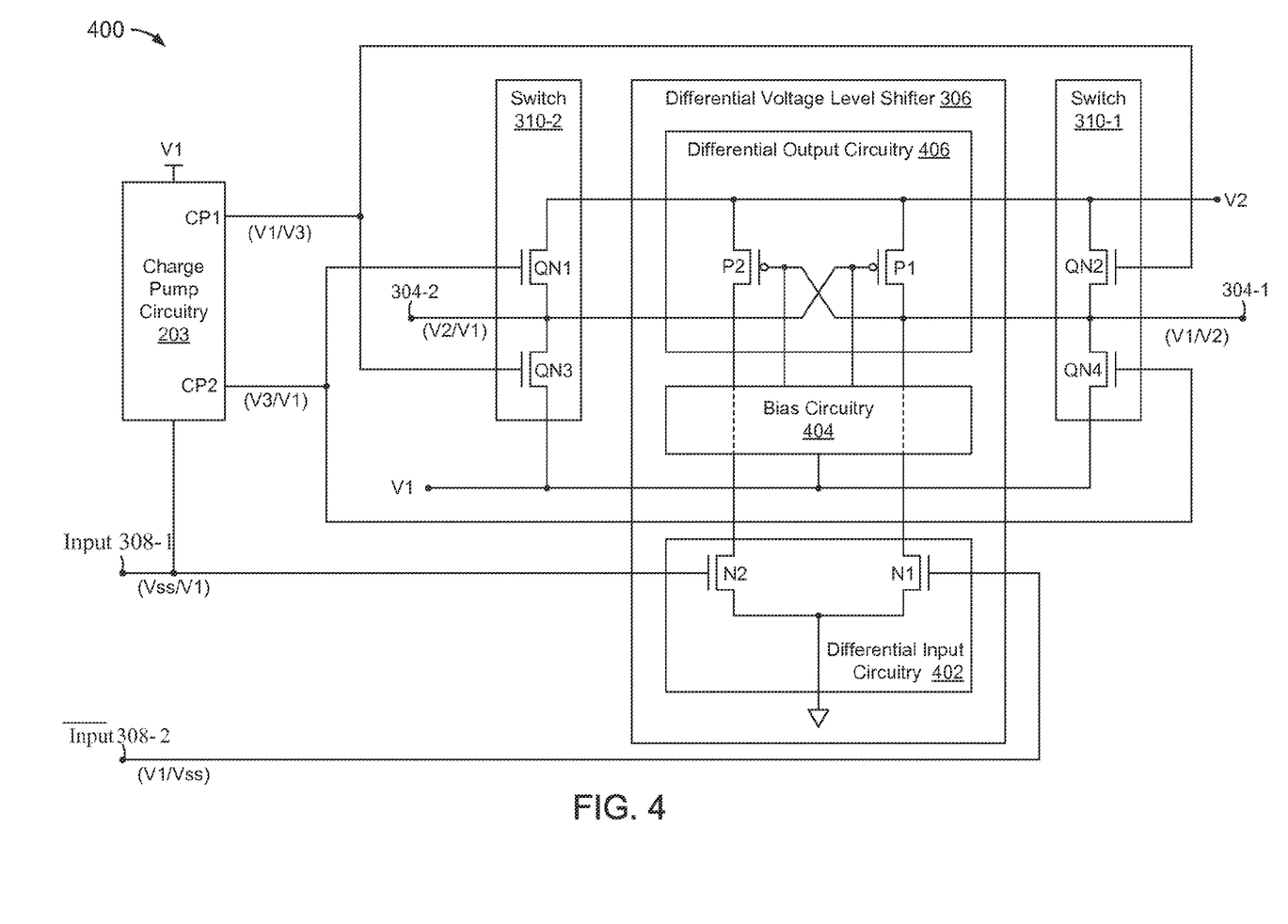
FIG. 4 is a block diagram of a circuit including an example implementation of the differential voltage level shifter of FIG. 3.

FIG. 4 is a block diagram of a circuit 400 including charge pump circuitry 203 and an example implementation of LS 306.

In FIG. 4, LS 306 includes differential input circuitry 402, illustrated here as including devices N1 and N2. LS 306 further includes a differential output circuit 406, illustrated here as including first and second devices P1 and P2.

When input 308-1 is at Vss and input 308-2 is at V1, device N2 turns off and device N1 turns on to pull output 304-1 toward Vss. As output 304-1 is pulled-down, device P2 turns on to pull-up output 304-2 towards V2. As output 304-2 is pulled-up, device P1 turns off, which reduces pull-down contention at output 304-1.

Conversely, when input 308-1 is at V1 and input 308-2 is at Vss, device N1 turns off and device N2 turns on to pull output 304-2 toward Vss. As output 304-2 is pulled-down, device P1 turns on to pull-up output 304-1 towards V2. As output 304-1 is pulled-up, device P2 turns off, which reduces pull-down contention at output 304-2.

LS 306 further includes bias circuitry 404 to control lower voltage limits of outputs 304-1 and 304-2. Bias circuitry 404 may also balance voltage swings of differential outputs 304-1 and 304-2. Bias circuitry 404 may be implemented as described below with reference to FIG. 5.

Figure 5:
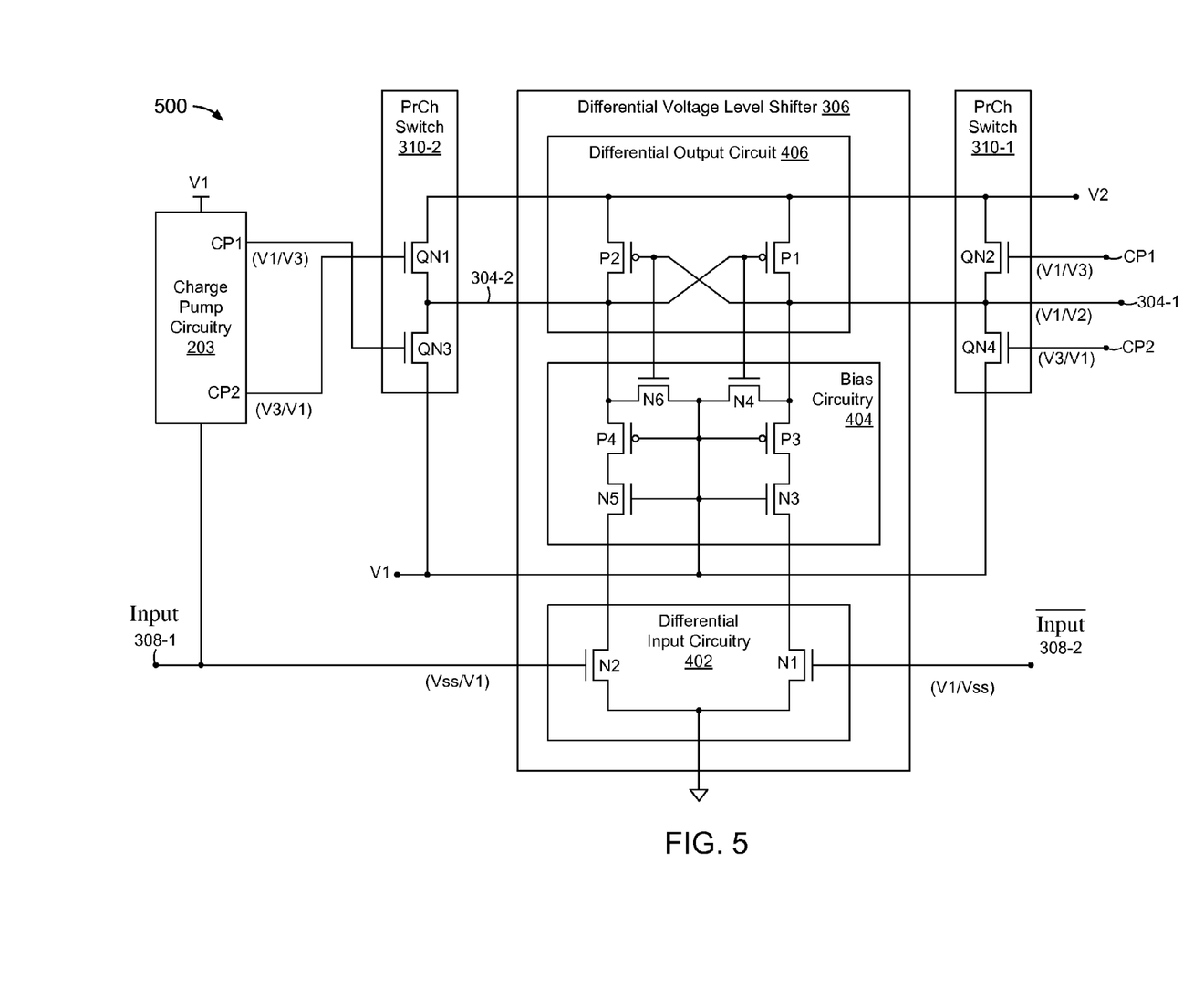
FIG. 5 is a diagram of a circuit including an example implementation of voltage level shift bias circuitry.

FIG. 5 is a diagram of a circuit 500 including charge pump circuitry 203 and an example implementation of bias circuitry 404 of LS 306.

Further to the description above with reference to FIG. 4, when input 308-1 is at Vss and input 308-2 is at V1, device N2 turns off and device N1 turns on to pull output 304-1 toward Vss through devices N3 and P3. As output 304-1 is pulled-down, device N4 turns on to apply V1 to output 304-1. When V1 is applied to output 304-1 through device N4, the source-to-gate voltage of device P3 falls to 0 to turn off device P3 to preclude output 304-1 from being pulled below V1. Bias circuitry 404 thus sets a lower limit of output 304-1 at V1.

Conversely, when input 308-1 is at V1 and input 308-2 is at Vss, device N1 turns off and device N2 turns on to pull output 304-2 toward Vss through devices N5 and P4. As output 304-2 is pulled-down, device N6 turns on to apply V1 to output 304-2. When V1 is applied to output 304-2 through device N6, the source-to-gate voltage of device P4 falls to 0 to turn off device P4 to preclude output 304-2 from being pulled below V1. Bias circuitry 404 thus sets a lower limit of output 304-2 at V1.

One or more of circuits 100, 200, 300, 400, and 500 may be implemented as a pre-driver to provide level-shifted data to a driver circuit, such as described below with reference to FIG. 6.

Figure 6:
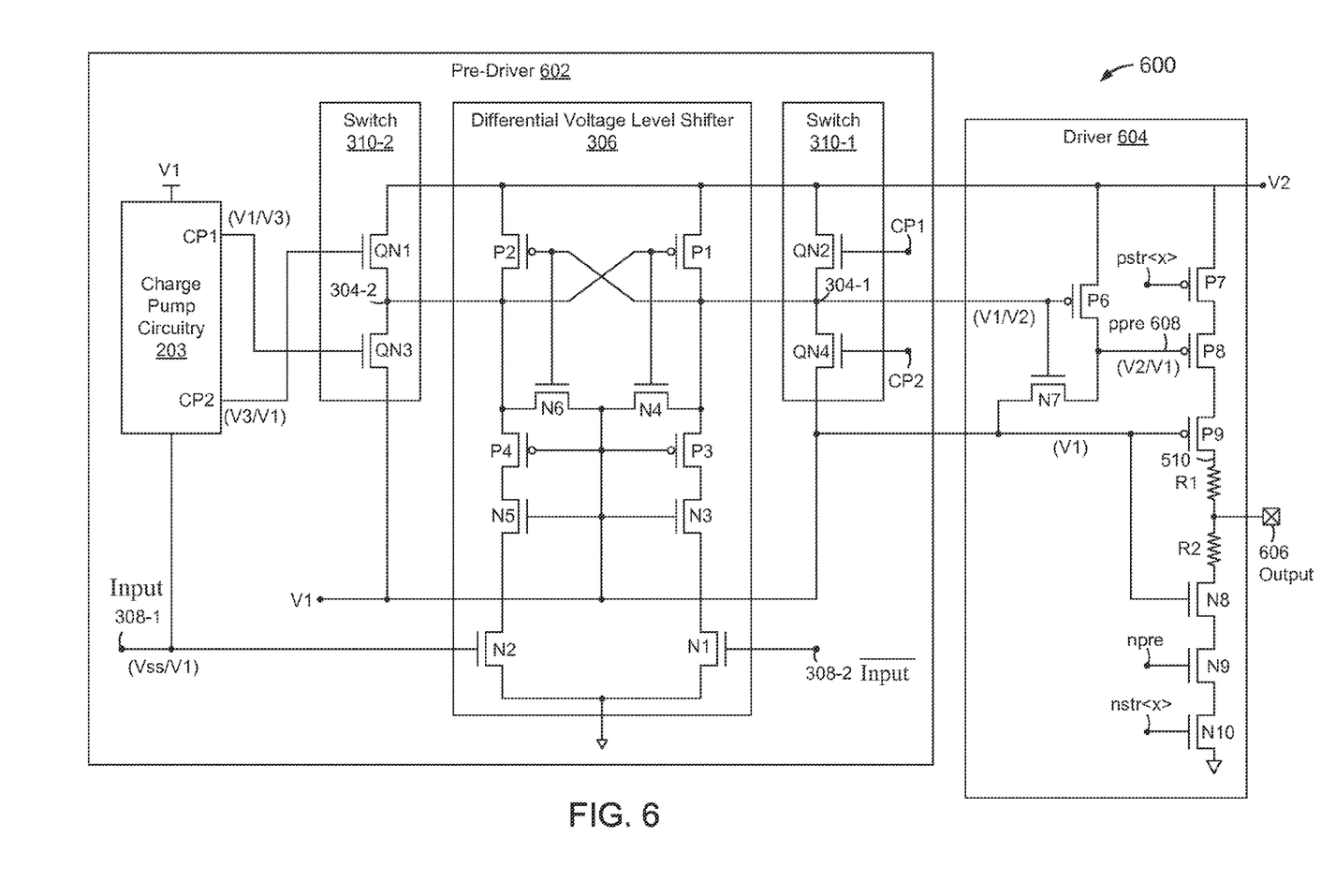
FIG. 6 is a circuit diagram of a driver system, including a pre-driver to provide charge pump assisted voltage level shifting, and a driver to drive level-shifted data from the pre-driver.

FIG. 6 is a circuit diagram of a driver system 600, including a pre-driver 602 to provide charge pump assisted voltage level shifting, and a driver 604 to drive level-shifted data from pre-driver 602.

Pre-driver 602 may include a voltage level shifter with charge pump assist as described above with reference to one or more of FIGS. 1 through 5. In FIG. 6, pre-driver 602 is illustrated as described above with reference to FIG. 5.

Driver 604 includes devices P6 and N7 to generate a ppre control 608 as an inverted version of level-shifted output 304-1 having a voltage swing of V2 to V1. Pre-driver 602 may be referred to as a ppre-driver.

Driver 604 further includes a stacked driver portion, including P-type devices P7, P8, and P9, and N-type devices N8, N9, and N10.

Gate nodes of devices P9 and N8 are biased with voltage V1. When differential output 304-1 is at V1, V2 is asserted on ppre control 608 to turn-off device P8. Where devices N8, N9, and N10 are all on, output 606 is coupled to Vss through a resistor R2. Conversely, when differential output 304-1 is at V2, V1 is asserted on ppre control 608 to turn-on device P8. Where device P7 is on and one or more of devices N8, N9, and N10 are off, V2 is asserted through a resistor R1 at output 606.

Driver 604 may represent a stacked, general purpose input/output (stacked GPIO) circuit, or a portion thereof.

Driver system 600 may represent a single pre-driver I/O architecture, with pre-driver 602 implemented as a single ppre-driver, with little or no additional area requirements relative to a voltage level shifter having a stacked transistor voltage divider to provide a bias voltage.

Figures 7, 8:
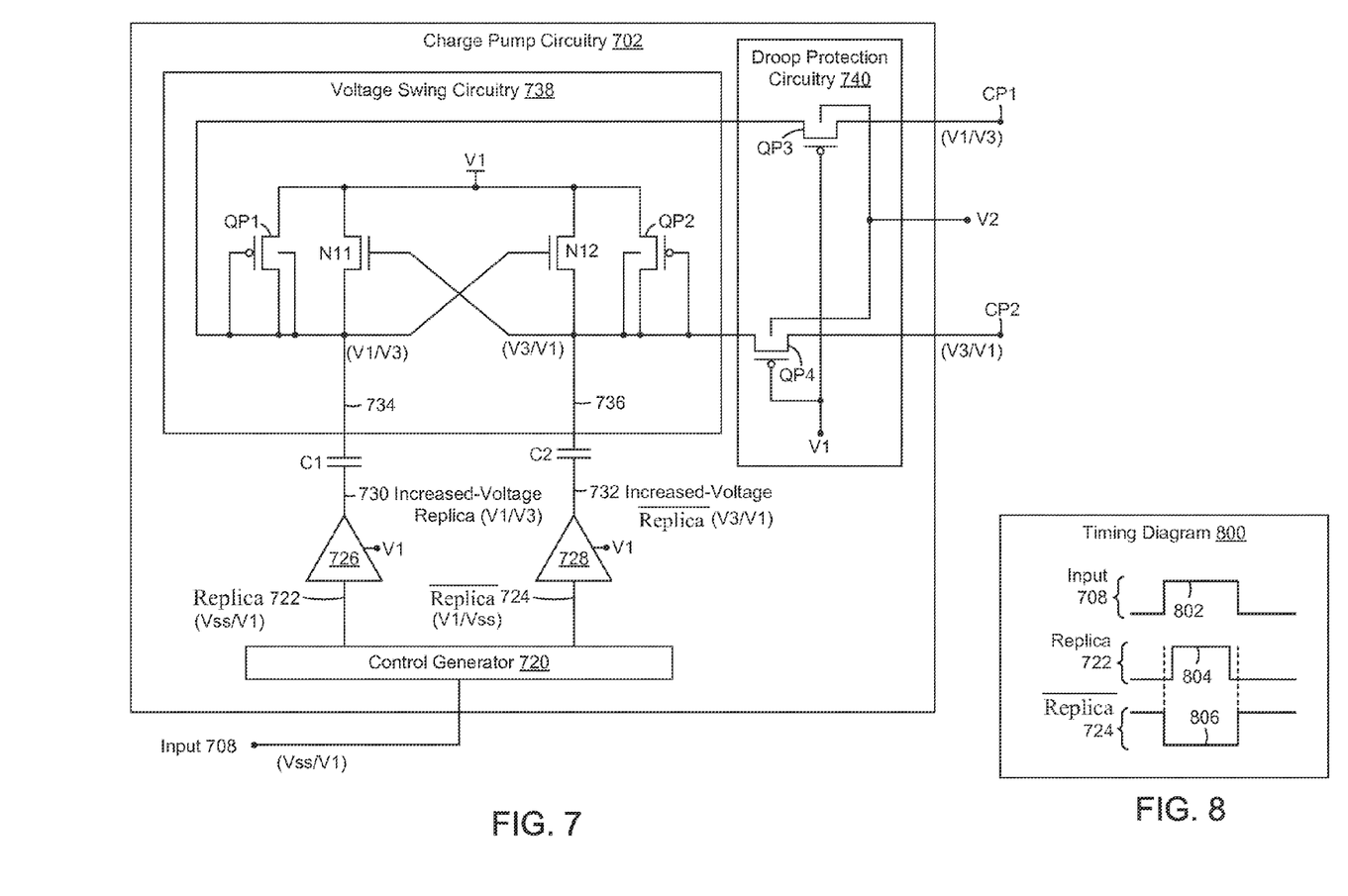
FIG. 7 is a circuit diagram of charge pump circuitry to provide voltage level shift assist.
FIG. 8 is a timing diagram to illustrate controls of FIG. 7 having non-over lapping edges.

FIG. 7 is a circuit diagram of charge pump circuitry 702 to provide voltage level shift assist.

In FIG. 7, charge pump circuitry 702 includes a control generator 720 to generate a replica 722 of an input 708, and a corresponding complimentary $\overline{\text{replica}}$ 724. Control generator 720 may be implemented to generate replica 722 and $\overline{\text{replica}}$ 724 with non-over lapping edges, such as described below with reference to FIG. 8.

FIG. 8 is a timing diagram 800 to illustrate an example input 708 and corresponding differential replicas 722 and 724 having non-over lapping edges.

In FIG. 8, input 708 includes a pulse 802, which is represented as a pulse 804 of replica 722, and as a corresponding inverted pulse 806 of $\overline{\text{replica}}$ 724. Rising and falling edges of pulse 804 do not overlap rising and falling edges of pulse 806. As stated further above, non-overlapping edges may be implemented preclude switches 212 and 214 (FIG. 2) and/or devices QN2 and QN4 (FIGS. 3-6), from being turned on at the same time.

In FIG. 7, charge pump circuitry 702 further includes first and second charge pumps 726 and 728, each to increase a voltage of a corresponding one of replica 722 and $\overline{\text{replica}}$ 724 to a voltage swing of V1/V3. Charge pumps 726 and 728 may be implemented as voltage multipliers to increase voltages of replica 722 and $\overline{\text{replica}}$ 724 by a multiple of an operating voltage, illustrated here as V1. In the example voltages further above, V3 is equal 2*V1.

Outputs of charge pumps 726 and 728 are illustrated here as an increased-voltage replica 730 and an increased-voltage replica 732.

Charge pump circuitry 702 may include first and second filters, illustrated here as capacitors C1 and C2 to filter corresponding charge pump outputs 730 and 732, to provide corresponding filtered controls 734 and 736. Controls 734 and 736 may be output as CP1 and CP2.

Where charge pump outputs 730 and 732 are used to drive N-type metal oxide semi-conductor (NMOS) devices (i.e., devices N11 and N12 in FIG. 7), with gate-to-source capacitance (Cgs) boot-strap out (i.e., devices QP3 and QP4 in FIG. 7), capacitors C1 and C2 may be relatively small. Where charge pump circuitry 702 is implemented with a 14 nanometer (nm) fabrication technology, for example, and operated with the example voltages provided above with reference to FIG. 2, capacitors may be approximately 40 femto Farads (fF). Methods and systems disclosed herein are not, however, limited to this example.

Charge pump circuitry 702 may include voltage swing circuitry 738, illustrated here as including devices QP1 and QP2 to provide controls 734 and 736 with an initial voltage swing of approximately V1.

Control 734 may be applied as a bulk voltage to bias QP1, and control 736 may be applied as a bulk voltage to bias QP2.

Charge pump circuitry 702 may include droop protection circuitry 740, illustrated here as including devices QP3 and QP4, to help ensure that transients do not cause CP1 or CP2 to droop below V1, which might otherwise cause electrical overstress (EOS).

When input 708 remains unchanged for an extended period of time, CP1 or CP2 may leak downward from V3 toward V1 with little or no adverse effect. This is because the voltage level shifter will thereafter maintain states of the output(s).

In the example voltages provided above with reference to FIG. 2, the upper swing limit of CP1 and CP2 (i.e., V3=3.6 volts), is greater than the upper voltage swing limit of output 104 (i.e., V2=3.3 volts), and is equal to 2*V1. Methods and systems disclosed herein are not, however, limited to these examples. Rather, it may be sufficient that the upper swing limit of CP1 and CP2 be greater than (V1+Vt), where Vt is a threshold voltage of switches QN1 and QN2, and less than a gate-to-bulk EOS voltage of switches QN1 and QN2.

Methods and systems disclosed herein may be implemented in hardware, including discrete circuit logic, integrated circuit logic, and/or application specific integrated circuit (ASIC) logic, and may be implemented as part of a domain-specific integrated circuit package, and/or a combination of integrated circuit packages.

Methods and systems disclosed herein may be implemented with respect to one or more of a variety of systems, such as described below with reference to FIG. 9 and/or 10.

Figure 9:
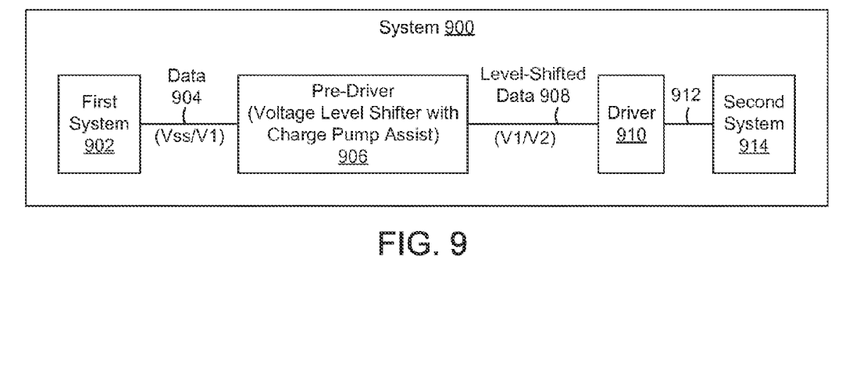
FIG. 9 is a block diagram of a system, including a pre-driver having a voltage level shifter with charge pump assist.
Figure 10:
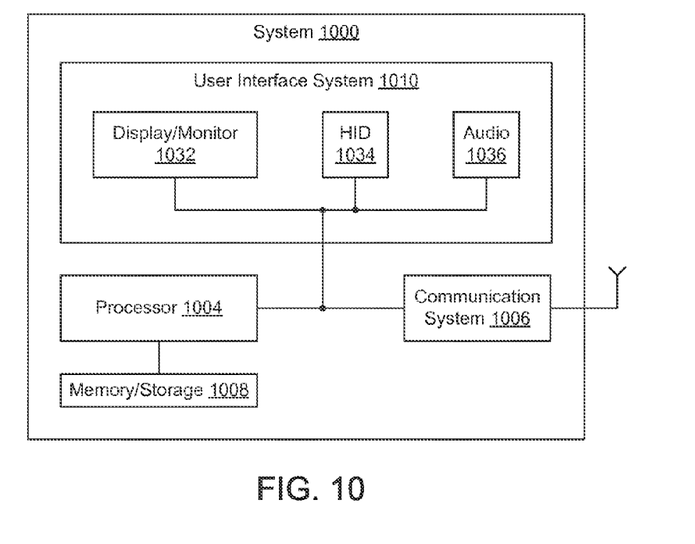
FIG. 10 is a block diagram of a system including a processor, a communication system, and a user interface system, within which voltage level shift with charge pump assist may be implemented.

FIG. 9 is a block diagram of a system 900, including a pre-driver 906 having a voltage level shifter with charge pump assist, to receive data 904 from a first system 902, and to provide corresponding level-shifted data 908 to a driver 910, and a driver 910 to provide corresponding level-shifted data 912 to a second system 914.

The voltage level shifter and charge pump of pre-driver 906, and/or driver 910, may be implemented as described in one or more examples herein.

Pre-driver 906 and driver 910 may be implemented as an output driver of first system 902, to provide level shifted data 912 to second system 914. First system 902, pre-driver 906, and driver 910 may be implemented, for example, on an integrated circuit (IC) die, to provide level shifted data 912 to an off-die or off-chip second system 914. Second device represent, for example, a peripheral computer device, such as, without limitation, a compact flash memory device. In this example, pre-driver 906 and driver 910 may represent a compact flash I/O (CFIO), GPIO hardware instrumentation package (HIP).

Alternatively, pre-driver 906 and driver 910 may be implemented as an input driver of second system 914, to receive and level shift data 904 from first system 902.

System 900 may be implemented as described below with reference to FIG. 10.

FIG. 10 is a block diagram of a system 1000 including a processor 1004, a communication system 1006 to interface with a network, a user interface system 1010, and communication infrastructure to communicate amongst processor 1004, communication system 1006, and user interface system 1010. Communication system 1006 may include a wired and/or wireless communication system. System 1000 may represent, for example, a computer system, a personal communication device, and/or a television set-top box.

System 1000 or portions thereof may be implemented within one or more integrated circuit dies, and may be implemented as a system-on-a-chip (SoC).

User interface system 1010 may include a monitor or display 1032 to display information from processor 1004.

User interface system 1010 may include a human interface device (HID) 1034 to provide user input to processor 1004. HID 1034 may include, for example and without limitation, one or more of a key board, a cursor device, a touch-sensitive device, and or a motion and/or image sensor. HID 1034 may include a physical device and/or a virtual device, such as a monitor-displayed or virtual keyboard.

User interface system 1010 may include an audio system 1036 to receive and/or output audible sound.

One or more of processor 1004, communication system 1006, and user interface system 1010 may include a voltage level shifter with charge pump assist to send and/or receive data to/from another one of processor 1004, communication system 1006, and user interface system 1010, and/or another device.

For example, and without limitation, processor 1004 may represent first system 902 in FIG. 9, and may include pre-driver 906 and driver 910 of FIG. 9 to send level-shifted data to a memory or storage device 1008, which may include a flash memory device.

System 1000 may include a housing, and one or more of processor 1004, communication system 1006, user interface system 1010, or portions thereof may be positioned within the housing. The housing may include, without limitation, a rack-mountable housing, a desk-top housing, a lap-top housing, a notebook housing, a net-book housing, a set-top box housing, a portable housing, and/or other conventional electronic housing and/or future-developed housing.

As disclosed herein, a voltage level shifter may be provided with charge pump assist means for assisting the voltage level shifter to toggle an output.

The charge pump assist means may include a charge pump assist circuit, such as described in one or more examples herein.

The charge pump assist means may include means for toggling the output at a higher rate than the voltage level shifter. The charge pump assist means and the voltage level shifter may be implemented in parallel with one another.

The voltage level shifter may be biased with an undivided voltage rail, such as an undivided operating voltage of the charge pump assist circuit.

The charge pump assist means may include control generator means for generating differential replicas of a single-ended input. The control generator means may include non-overlapping generator means for generating the differential replicas with non-overlapping edges.

The charge pump assist means may further include first and second charge pumps, each to increase a voltage of a corresponding one of the differential replicas. The first and second charge pumps may each include a charge pump voltage multiplier to increase the voltage of the corresponding replica by a multiple of an operating voltage of the charge pump assist circuit.

The charge pump assist means may further include a differentially controllable switch to couple the output to one of first and second output voltage rails under based on outputs of the first and second charge pumps.

The voltage level shifter may include differential outputs, and the charge pump assist means may include first and second differential switches, each to couple a corresponding one of the differential outputs to one of the first and second output voltage rails based on the outputs of the first and second charge pumps.

The charge pump assist means may include means for setting an initial voltage difference between outputs of charge pump assist circuit.

The charge pump assist means may include means for precluding outputs of the charge pump assist circuit from falling below a bias voltage of the voltage level shifter.

The charge pump assist means and voltage level shifter may be implemented as an output driver to provide level-shifted data to another system, such as an off-die or off-chip system. Alternatively, the charge pump assist means and voltage level shifter may be implemented an input driver to level-shift data received from an off-die or off-chip system.

A level-shifted output of the voltage level shifter and charge pump assist means may be provided to a stacked-transistor driver.

As further disclosed herein, a system may include a first device to generate data, a second device to receive the data, a voltage level shifter to level shift the data from a voltage swing of the first device to a voltage swing of the second device, and charge pump assist means to assist the voltage level shifter to toggle an output.

The system may include one or more of a processor, a communication system to communicate with a communication network, a user interface system, and communication infrastructure to communicate amongst the processor, the communication system, and the user interface system. The voltage level shifter and charge pump assist means may be implemented to level-shift data provided by one or more of the processor, the communication system, and the user interface system.

The system may further include flash memory, and the voltage level shifter and charge pump assist means may be implemented to level shift data between the processor and the flash memory.

The communication system may include a wireless communication system, and the system, or a portion thereof, may be positioned within a housing, such as a mobile or hand-held device.

Methods and systems are disclosed herein with the aid of functional building blocks illustrating functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the example embodiments disclosed herein.

What is claimed is:

1. An apparatus, comprising:
   a first node to receive a signal that switches between first and second voltages;
   a voltage level shifter to assert one of the second voltage and a third voltage at a second node based on a voltage at the first node, wherein the second voltage is greater than the first voltage, and wherein the third voltage is greater than the second voltage; and
   a charge pump assist circuit to assert a same one of the second and third voltages at the second node as the voltage level shifter, based on the voltage at the first node.

2. The apparatus of claim 1, wherein:
   the voltage level shifter include first and second circuitry to assert respective ones of the second and third voltages at the second node, maintain the respective asserted voltages at the second node, and contend with one another when a voltage at the first node changes between the first and second voltages,
   the charge pump assist circuit is configured assert the same one of the second and third voltages at the second node as the voltage level shifter, with a delay that is less that a delay of the voltage level shifter; and
   the delay of the voltage level shifter is due in part to contention between the first and second circuitry.

3. The apparatus of claim 1, wherein the charge pump assist circuit includes:
   a voltage multiplier to receive the first and second voltages from respective first and second voltage rail of the apparatus as respective reference and operating voltages, generate the third voltage as a multiple of the second voltage, and output one of the first and second and third voltages based on the voltage at the first node; and
   a switch circuit to receive the second voltage from the second voltage rail and the third voltage from a third voltage rail of the apparatus as respective reference and operating voltages, and to assert the same one of the second and third voltages at the second node as the voltage level shifter based on the output of the voltage multiplier.

4. The apparatus of claim 1, wherein the voltage level shifter is configured to receive the first and third voltages from respective first and third voltage rails of the apparatus as respective reference and operating voltages.

5. The apparatus of claim 4, further including bias circuitry to bias the voltage level shifter to with the first voltage undivided.

6. The apparatus of claim 1, further including:
   a stacked-transistor driver to receive the first voltage as a reference voltage and the third voltage as an operating voltage, generate the second voltage based on the first and third voltages, and assert one of the received third voltage and the generated second voltage based on a voltage at the second node.

7. The apparatus of claim 1, wherein the voltage level shifter and the charge pump assist circuit are configured to consume less power when the voltage at the first node is constant, relative to power consumed by a stacked transistor voltage divider-based voltage level shifter.

8. The apparatus of claim 1, wherein the charge pump assist circuit includes:
   a control generator to generate first and second differential voltages having non-overlapping edges based on a voltage at the first node; and
   first and second charge pumps, each to increase a voltage of a respective one of the first and second differential voltages.

9. The apparatus of claim 8, wherein the first and second charge pumps each include a voltage multiplier to increase the voltage of the respective one of the first and second differential voltages by a multiple of an operating voltage of the charge pump assist circuit.

10. The apparatus of claim 8, wherein the charge pump assist circuit further includes a differentially controllable switch to receive the second and third voltages as respective reference and operating voltages from respective voltage rails of the apparatus, and assert one of reference and operating voltages at the second node based on outputs of the first and second charge pumps.

11. The apparatus of claim 8, wherein:
   the second node includes first and second differential output nodes; and
   the charge pump assist circuit includes first and second differential switches to assert one of the second and third voltages at one of the first and second differential output nodes and the other one of the second and third voltages at the other one of the first and second differential output nodes based on outputs of the first and second charge pumps.

12. The apparatus of claim 8, wherein the charge pump assist circuit further includes:
   circuitry to set an initial voltage difference between outputs of the first and second charge pumps.

13. The apparatus of claim 8, wherein the charge pump assist circuit further includes:
   circuitry to preclude outputs of the first and second charge pumps from falling below a bias voltage of the voltage level shifter.

14. An apparatus, comprising:
   a processor;
   a communication system to communicate with a communication network;
   communication infrastructure to communicate amongst the processor, the communication system, and a user interface system; and
   voltage level shift circuitry that includes,
      a first node to receive a signal that switches between first and second voltages,
      a voltage level shifter to assert one of the second voltage and a third voltage at a second node based on a voltage at the first node, wherein the second voltage is greater than the first voltage, and wherein the third voltage is greater than the second voltage, and
      a charge pump assist circuit to assert a same one of the second and third voltages at the second node as the voltage level shifter, based on the voltage at the first node;
   wherein the voltage level shifter and the charge pump assist circuit are configured to voltage level shift data provided by one of the processor, the communication system, and the user interface system.

15. The apparatus of claim 14, wherein the communication system includes a wireless communication system.

16. The apparatus of claim 14, further including a housing, wherein the processor, the communication system, voltage level shifter, the charge pump assist circuit, and at least a portion of the user interface system are positioned within the housing.

17. The system of claim 14, wherein the charge pump assist circuit includes:
   control generator to generate first and second differential voltages having non-overlapping edges based on a voltage at the first node; and
   first and second charge pumps, each to increase a voltage of a respective one of the first and second differential voltages.

18. The system of claim 17, wherein the first and second charge pumps each include a voltage multiplier to increase the voltage of the respective one of the first and second differential voltages by a multiple of an operating voltage of the charge pump assist circuit.

19. The system of claim 17, wherein the charge pump assist circuit further includes a differentially controllable switch to receive the second and third voltages as respective reference and operating voltages from respective voltage rails of the apparatus and assert one of reference and operating voltages at the second node based on outputs of the first and second charge pumps.

\* \* \* \* \*